United States Patent
Kwak et al.

(10) Patent No.: US 7,235,485 B2
(45) Date of Patent: Jun. 26, 2007

(54) METHOD OF MANUFACTURING SEMICONDUCTOR DEVICE

(75) Inventors: Jun-keun Kwak, Seoul (KR); Roland Hampp, Poughkeepsie, NY (US)

(73) Assignees: Samsung Electronics Co., Ltd., Suwon-si (KR); Infineon Technology North America Corp., San Jose, CA (US)

( * ) Notice: Subject to any disclaimer, the term of this patent is extended or adjusted under 35 U.S.C. 154(b) by 0 days.

(21) Appl. No.: 11/251,180

(22) Filed: Oct. 14, 2005

(65) Prior Publication Data

US 2007/0087560 A1  Apr. 19, 2007

(51) Int. Cl.
*H01L 21/44* (2006.01)

(52) U.S. Cl. ............ 438/685; 438/311; 438/637; 438/648; 438/656; 257/E21.17; 257/E21.168; 257/E21.304

(58) Field of Classification Search ........ 438/685, 438/656, 311, 680, 681, 692, 637, 648, 582, 438/900, 903

See application file for complete search history.

(56) References Cited

U.S. PATENT DOCUMENTS 6,066,366 A * 5/2000 Berenbaum et al. ........ 427/250
6,162,715 A * 12/2000 Mak et al. .................. 438/592
6,274,472 B1 * 8/2001 Hossain et al. ............. 438/598
6,309,966 B1 * 10/2001 Govindarajan et al. ..... 438/656
6,797,340 B2 * 9/2004 Fang et al. ................. 427/585
6,939,804 B2 * 9/2005 Lai et al. .................... 438/680
7,005,372 B2 * 2/2006 Levy et al. ................. 438/627

FOREIGN PATENT DOCUMENTS

JP             8124876       5/1996
KR       1020020046467       6/2002
KR         10-0364257       11/2002

* cited by examiner

*Primary Examiner*—David Nhu
(74) *Attorney, Agent, or Firm*—F. Chau & Associates, LLC (57) ABSTRACT

Provided is a method of manufacturing a semiconductor device with enhanced electrical characteristics. The method includes disposing a substrate on a substrate support in a process chamber, pre-heating the substrate on the substrate support adjusted to a temperature from 300 to 400° C. for 60 seconds or more, forming a silicon protective layer on the substrate by supplying a silicon source gas into the process chamber and heating the substrate on the substrate support adjusted to a temperature from 300 to 400° C. for 10 seconds or more, and forming a tungsten layer on the silicon protective layer.

20 Claims, 12 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and more particularly, to a method of manufacturing a semiconductor device with enhancements of its electrical characteristics.

2. Description of the Related Art

With a continuing trend towards large-scale integration of semiconductor devices, the aspect ratio of contact holes has increased. Thus, a tungsten plug is used to ensure good step coverage even when the aspect ratio of a contact hole is more than 2, and to enhance connection capability between a substrate and a first wire.

Generally, a tungsten plug is fabricated in the following manner. First, a barrier layer such as a Ti layer/TiN layer is formed on an insulating layer pattern having a contact hole therein, and a tungsten layer is deposited so that the insulating layer pattern is fully filled. Then, the tungsten layer is planarized so that an upper surface of the insulating layer pattern is exposed to thereby completing the tungsten plug.

In particular, deposition of the tungsten layer is done by reduction of a $WF_6$ gas, which is a tungsten source gas, by a $SiH_4$ gas, which is a silicon source gas, or a $H_2$ gas. At this time, fluorine ions generated by the reduction reaction react with the Ti layer through a pinhole or impurity defect of the TiN layer to generate TiFx gas bubbles. Therefore, the volume of the Ti layer increases to penetrate the TiN layer, which will result in an explosive phenomena (referred to as "volcano defects", hereinafter) at an angled region of the contact hole such as an inlet of a contact hole or a less dense region of a TiN layer.

In this regard, to prevent penetration of fluorine ions, the thickness of the TiN layer should be sufficiently increased. However, the TiN layer having an increased thickness undesirably has increased contact resistance and a reduced diameter of the contact hole. Therefore, the insulating layer pattern is insufficiently filled by the tungsten layer. In particular, when the TiN layer is thickly sputtered at the entrance of the contact hole, forming a partially projected "overhanging-shape," it further reduces the diameter of the contact hole.

SUMMARY OF THE INVENTION

The present invention provides a method of manufacturing a semiconductor device with enhanced electrical characteristics.

The above stated object as well as other objects, features and advantages, of the present invention will become clear to those skilled in the art upon review of the following description.

According to an aspect of the present invention, there is provided a method of manufacturing a semiconductor device, the method including: disposing a substrate on a substrate support in a process chamber; pre-heating the substrate on the substrate support adjusted to a temperature from 300 to 400° C. for 60 seconds or more; forming a silicon protective layer on the substrate by supplying a silicon source gas into the process chamber and heating the substrate on the substrate support adjusted to a temperature from 300 to 400° C. for 10 seconds or more; and forming a tungsten layer on the silicon protective layer.

According to another aspect of the present invention, there is provided a method of manufacturing a semiconductor device, the method including forming a tungsten nucleation layer on a substrate by repeated cycles of supplying a tungsten source gas, purging the tungsten source gas, supplying a silicon source gas, and purging the silicon source gas, and forming a bulk tungsten layer at a higher temperature than in the formation of the tungsten nucleation layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The present invention will now be described more fully with reference to the accompanying drawings, in which exemplary embodiments of the invention are shown.

Figure 1:
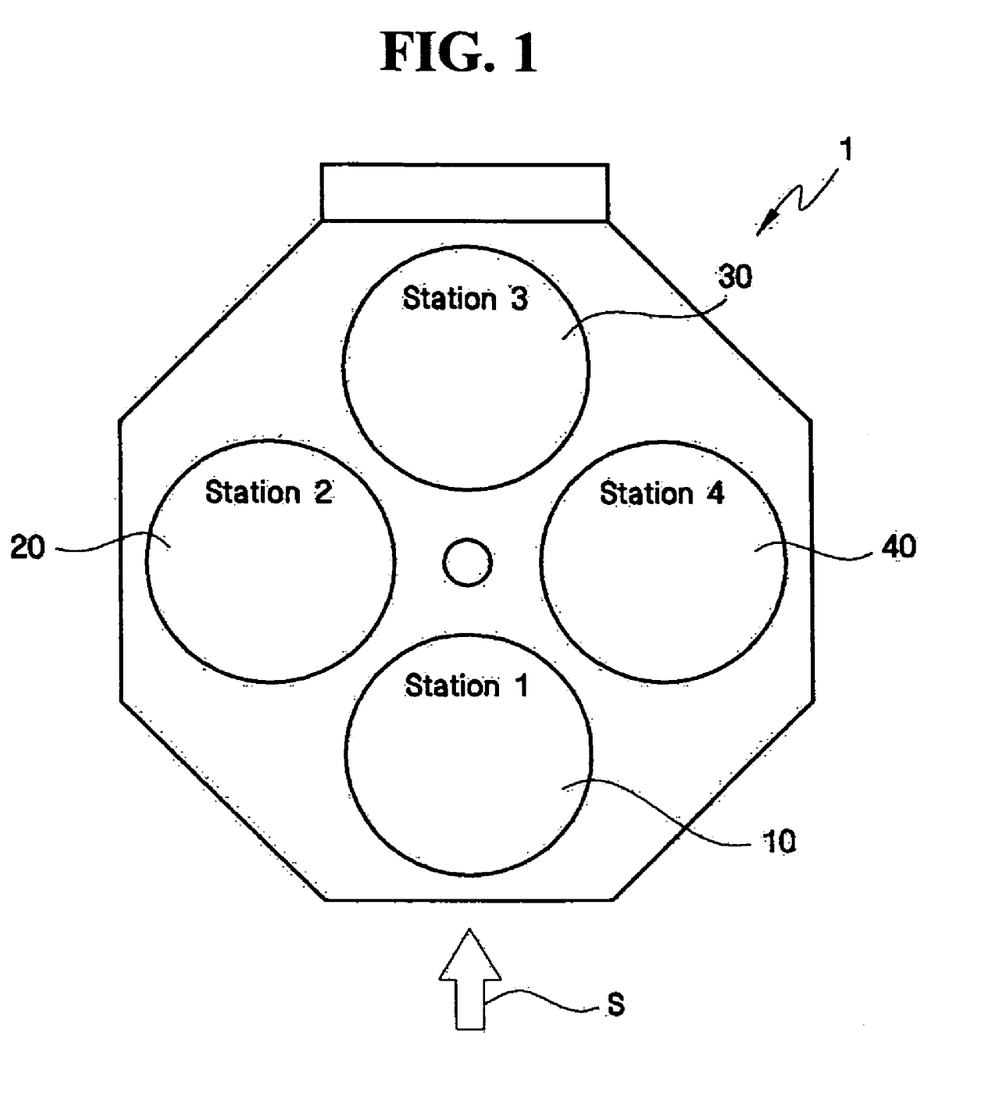
FIG. 1 is a schematic plan view illustrating a tungsten deposition apparatus used for a method of manufacturing a semiconductor device according to an embodiment of the present invention.
Figure 2:
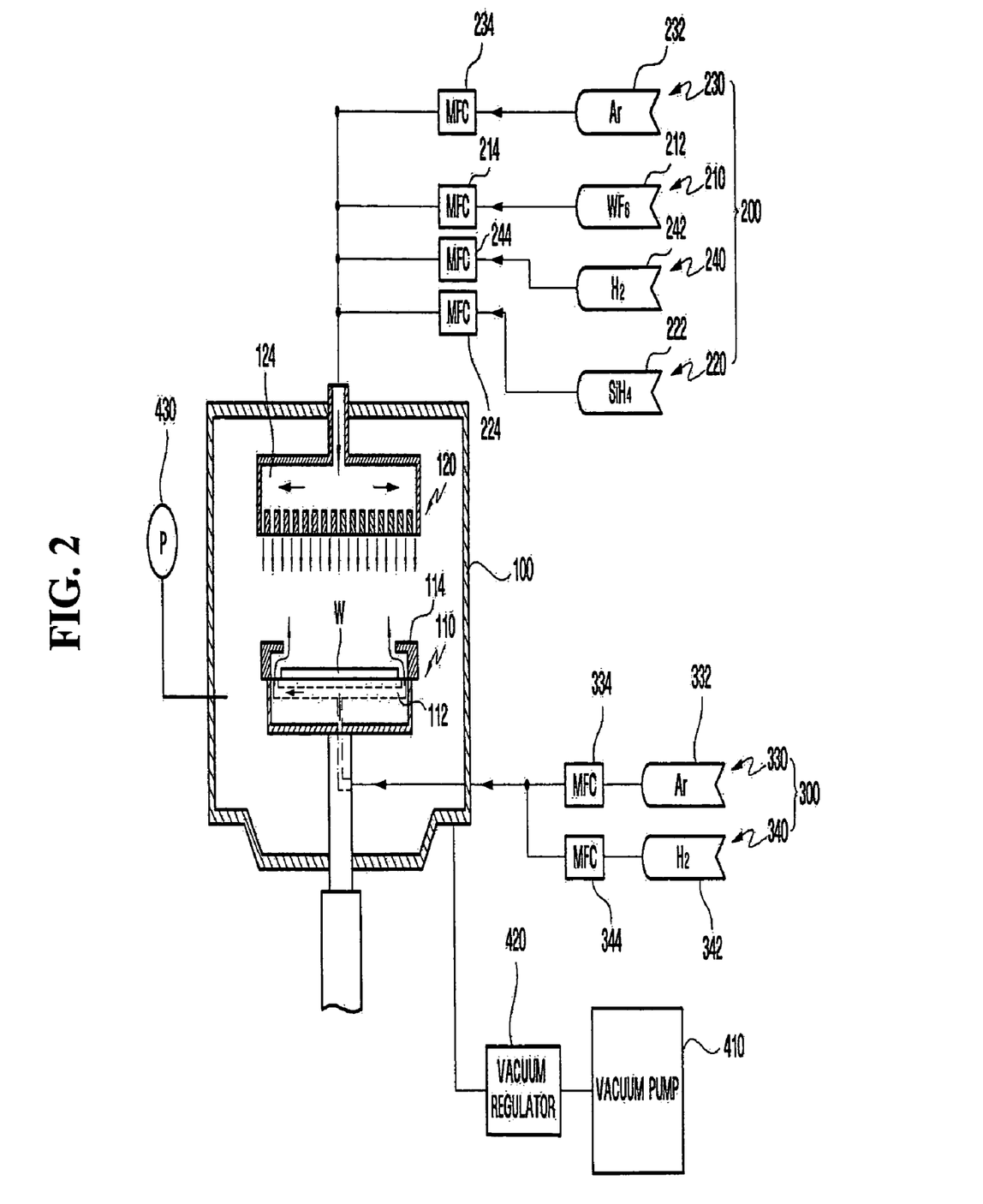
FIG. 2 is a sectional view illustrating a tungsten deposition apparatus used for a method of manufacturing a semiconductor device according to an embodiment of the present invention.

FIG. 1 is a schematic plan view illustrating a tungsten deposition apparatus used for a method of manufacturing a semiconductor device according to an embodiment of the present invention, and FIG. 2 is a sectional view illustrating a tungsten deposition apparatus used for a method of manufacturing a semiconductor device according to an embodiment of the present invention. For convenience of illustration, only one station in the process chamber 100 will be illustrated by way of example.

Referring first to FIG. 1, a tungsten deposition apparatus 1 according to an embodiment of the present invention includes a plurality of stations in a process chamber. For example, in the process chamber, four substrate supports may be arranged in a circular shape, and four stations 10, 20, 30, and 40 may be formed. A substrate is incorporated into the process chamber in the direction of an arrow S, and sequentially processed on the first through fourth stations 10, 20, 30, and 40, to thereby deposit a tungsten layer with a desired thickness.

Referring to FIG. 2, the tungsten deposition apparatus (1 shown in FIG. 1) according to an embodiment of the present invention includes a process chamber 100, a substrate support 110, a shower head 120, a reaction gas supply unit 200, a back-side gas supply unit 300, a vacuum pump 410, and a vacuum gauge 430.

The process chamber 100 is a space where a tungsten deposition process is performed, and contains a station (one of the first through fourth stations 10, 20, 30, and 40 of FIG. 1).

The station includes a substrate support 110 and a shower head 120. A substrate W is disposed on the substrate support 110. The substrate support 110 includes an inlet pipe 112 through which a back-side gas passes, a ring clamp 114 blocking the flow of a reaction gas, in particular, a $WF_6$ gas, into an edge of the substrate W, and a heater (not shown) adjusting the temperature of the substrate support 110.

The shower head 120 is disposed over the substrate support 110 to be separated from the substrate support 110 by a predetermined distance, and bored through one sidewall of the process chamber 100. The shower head 120 is connected to reaction gas supply portions 210, 220, 230, and 240 via respective reaction gas flow regulators 214, 224, 234, and 244. A reaction gas inlet pipe 124 is formed in the shower head 120.

The reaction gas supply unit 200 includes a tungsten source gas supply portion 210, a silicon source gas supply portion 220, a first inert gas supply portion 230, and a first reduced gas supply portion 240. The tungsten source gas supply portion 210 includes a tungsten source gas storage container 212 and a tungsten source gas flow regulator 214. The silicon source gas supply portion 220 includes a silicon source gas storage container 222 and a silicon source gas flow regulator 224. The first inert gas supply portion 230 includes a first inert gas storage container 232 and a first inert gas flow regulator 234. The first reduced gas supply portion 240 includes a first reduced gas storage container 242 and a first reduced gas flow regulator 244.

Here, a tungsten source gas may be $WF_6$, $WF_3$, or combination thereof, and a silicon source gas may be DCS (DiChloroSilane), TCS (TriChloroSilane), HCS (HexaChloroSilane), $SiH_4$, $Si_2H_6$, or a combination thereof. In this embodiment, the tungsten source gas, the silicon source gas, the first inert gas, and the first reduced gas are illustrated by $WF_6$ gas, $SiH_4$ gas, Ar gas, and $H_2$ gas, respectively, but the present invention is not limited thereto.

The tungsten source gas, the silicon source gas, the first inert gas, and the first reducing gas are supplied to the shower head 120 of the process chamber 100 at a flow rate controlled by the respective flow regulators 214, 224, 234, and 244. Here, the flow regulators 214, 224, 234, and 244 may be MFCs (Mass Flow Controllers), needle valves, air valves, etc. In this embodiment, the flow regulators 214, 224, 234, and 244 are illustrated by MFCs. However, any flow regulator capable of controlling a reaction gas flow rate can be used. Furthermore, in this embodiment, the flow regulators 214, 224, 234, and 244 are independently controlled, but a multiple-component flow regulator commonly controlling the flow rates of a plurality of reaction gases may also be used.

The back-side gas supply unit 300 includes a second inert gas supply portion 330 and a second reduced gas supply portion 340. The second inert gas supply portion 330 includes a second inert gas storage container 332 and a second inert gas flow regulator 334. The second reduced gas supply portion 340 includes a second reduced gas storage container 342 and a second reduced gas flow regulator 344. In this embodiment, a second inert gas and a second reduced gas are illustrated by Ar gas and $H_2$ gas, respectively, but the present invention is not limited thereto. The second inert gas and the second reduced gas are supplied to the substrate support 110 of the process chamber 100 at a flow rate controlled by the respective flow regulators 334 and 344.

The vacuum pump 410 is connected to the process chamber 100 via a vacuum regulator 420 so that a tungsten deposition process is done in a predetermined pressure condition. The vacuum gauge 430 is attached to the process chamber 100 and monitors an internal pressure of the process chamber 100 while the tungsten deposition process proceeds.

Figure 3:
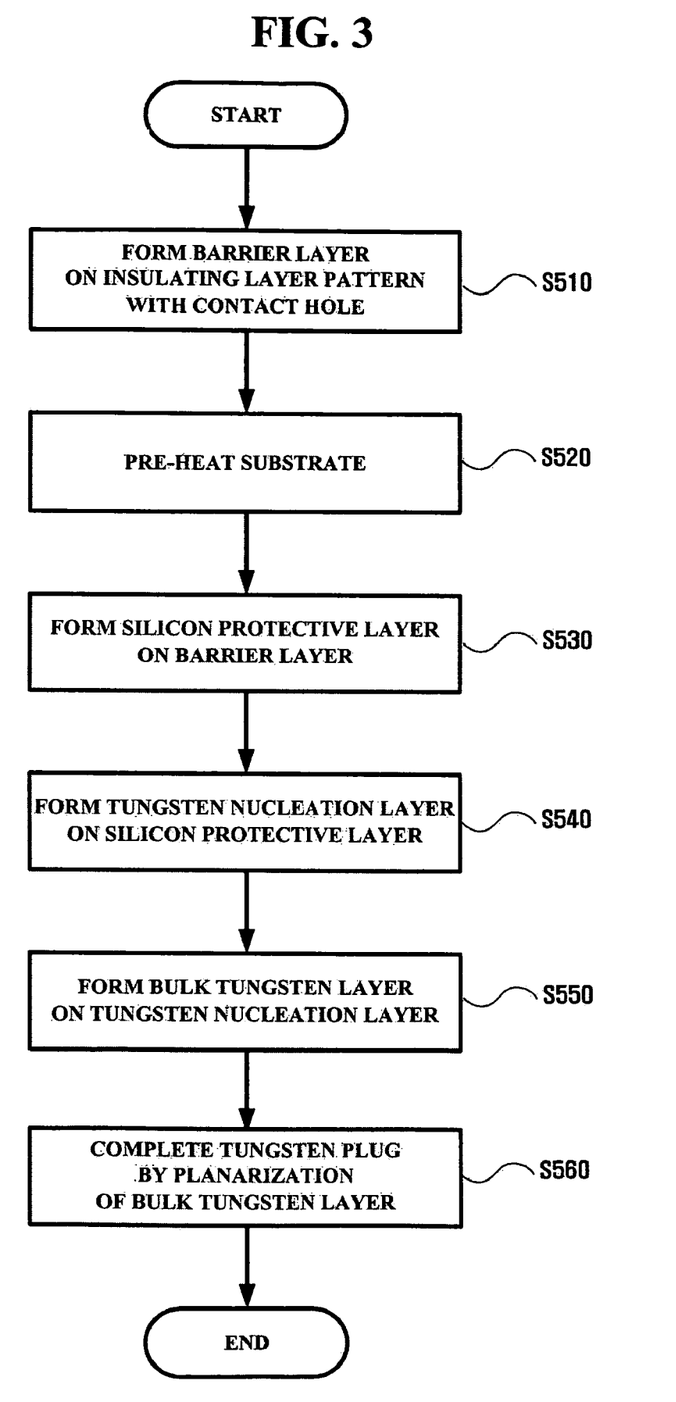
FIG. 3 is a flow diagram illustrating a method of manufacturing a semiconductor device according to an embodiment of the present invention.
Figure 4A:
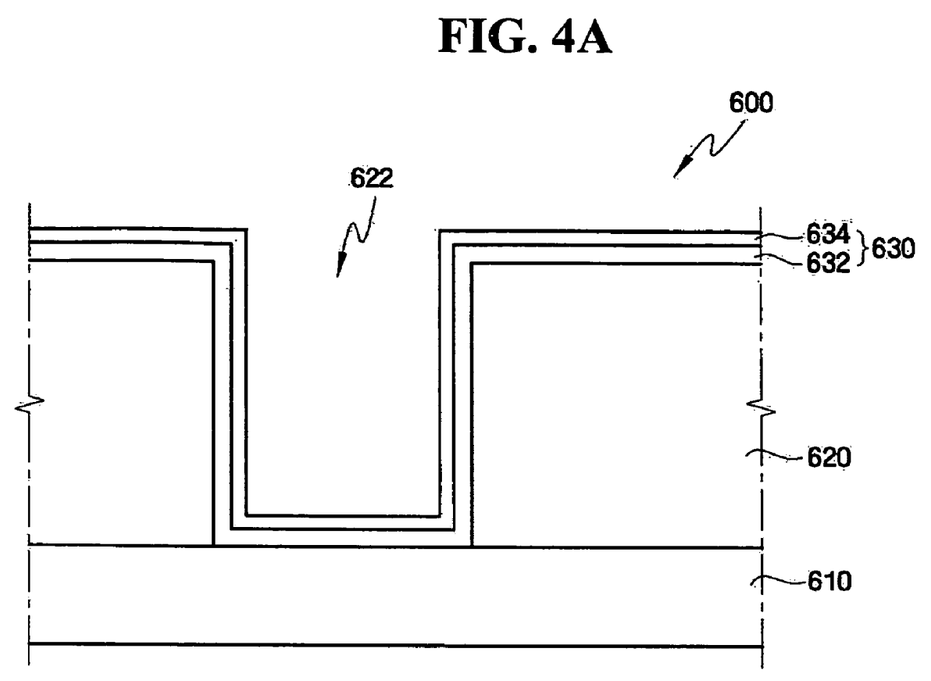
FIGS. 4A through 4E are sectional views illustrating a method of manufacturing a semiconductor device according to an embodiment of the present invention.
Figure 4B:
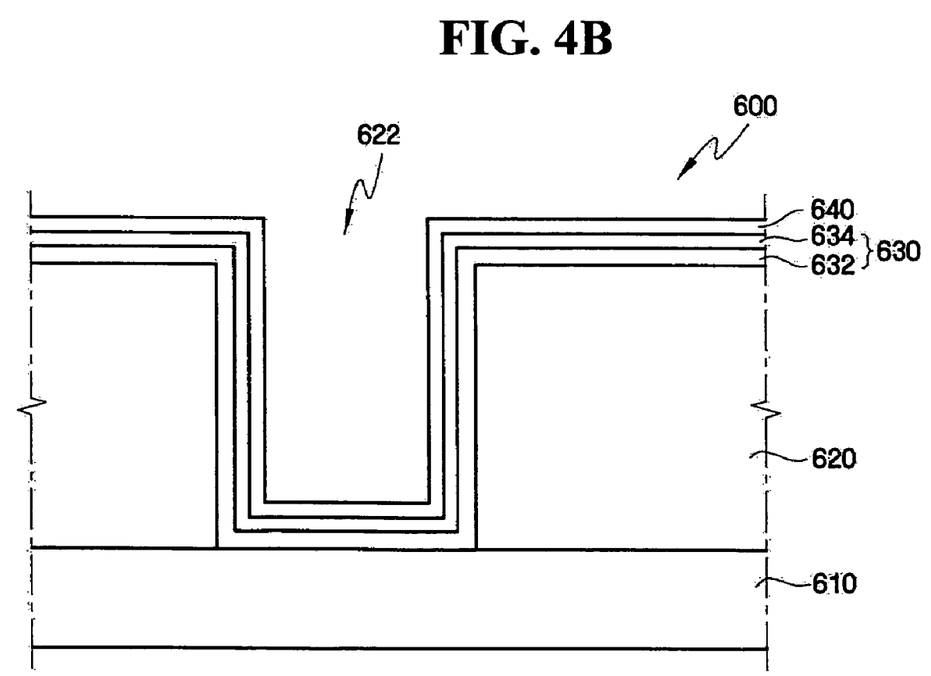
Figure 4C:
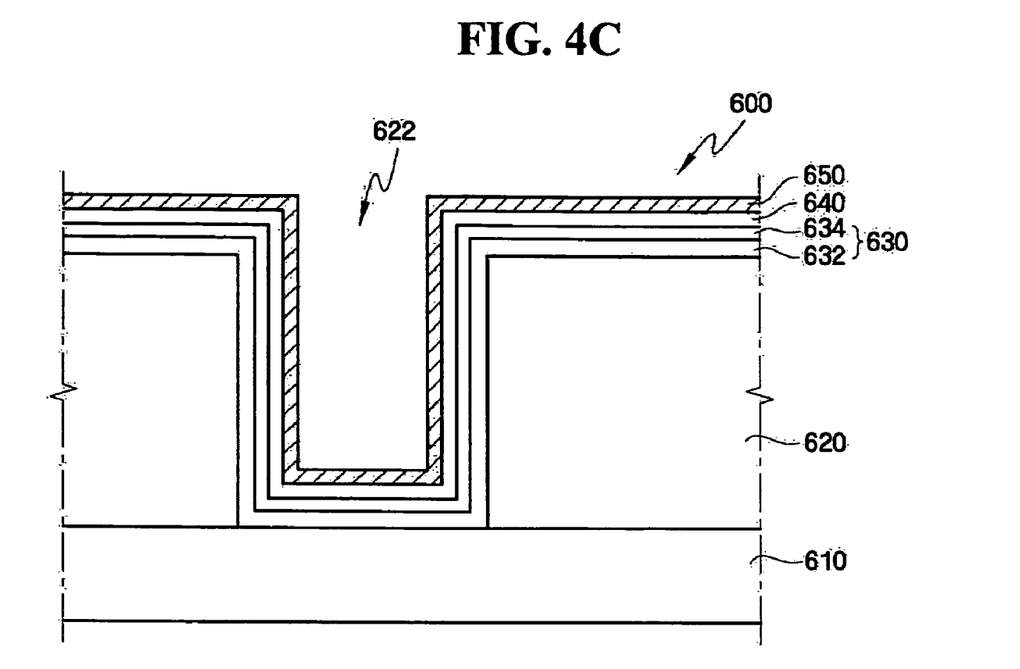
Figure 4D:
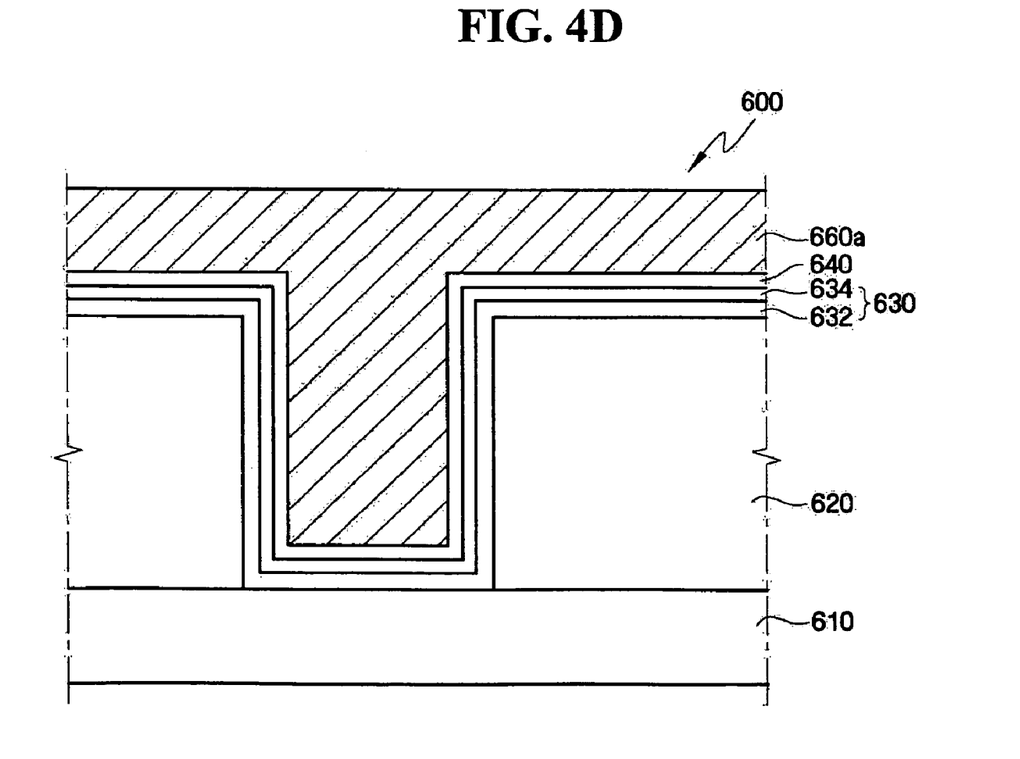
Figure 4E:
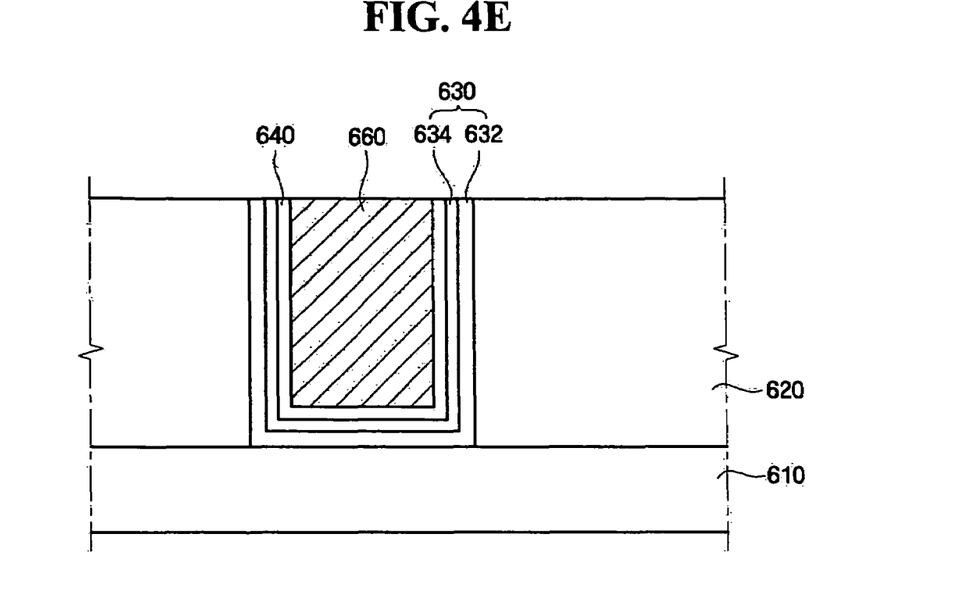
Figure 5:
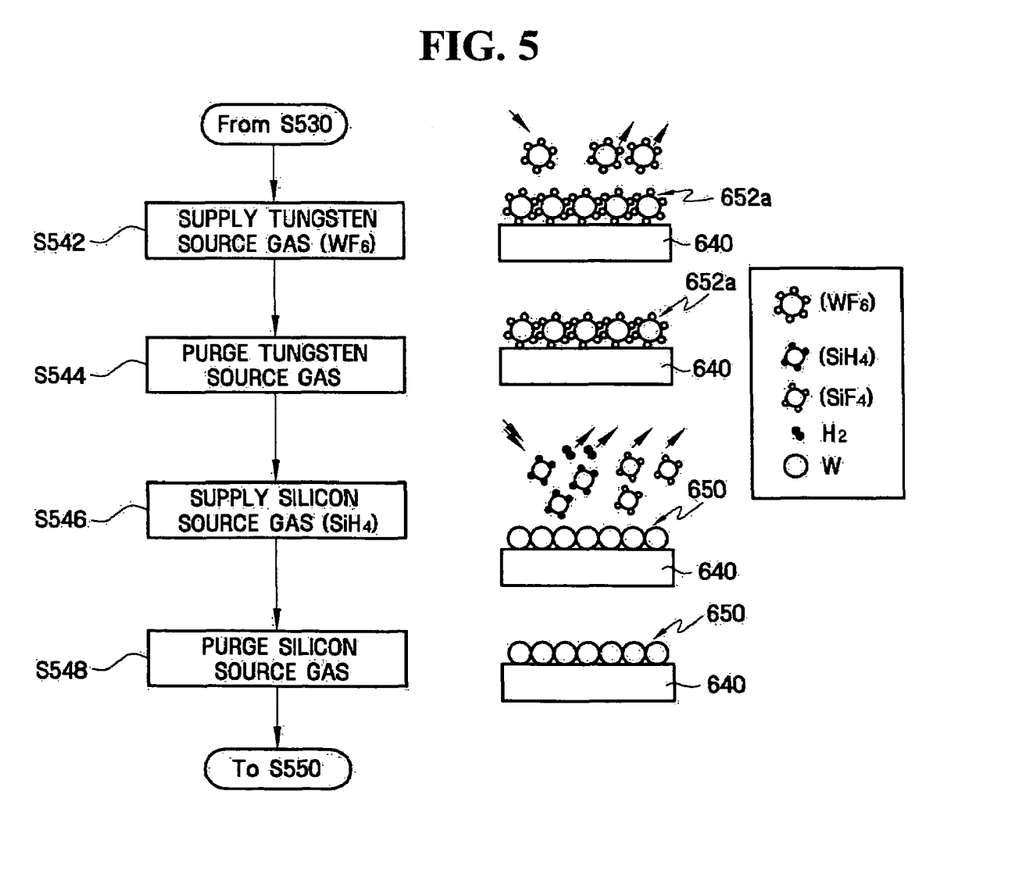
FIG. 5 is a flow diagram illustrating a tungsten nucleation process of FIG. 3.

FIG. 3 is a flow diagram illustrating a method of manufacturing a semiconductor device according to an embodiment of the present invention, FIGS. 4A through 4E are sectional views illustrating a method of manufacturing a semiconductor device 600 according to an embodiment of the present invention, and FIG. 5 is a flow diagram illustrating a tungsten nucleation process of FIG. 3. In the shown embodiment, a tungsten plug is illustrated by a contact plug connecting a substrate and a first wire, but may be a via plug connecting wires. Hereinafter, a tungsten source gas, a silicon source gas, a first/second inert gas, and a first/second reducing gas will be illustrated by $WF_6$ gas, $SiH_4$ gas, Ar gas, and $H_2$ gas, respectively.

Referring to FIGS. 3 and 4A, a barrier layer 630 is first formed on an insulating layer pattern 620 having therein a contact hole 622 which is formed on a substrate 610 (S510). Then, the substrate 610 having the barrier layer 630 thereon is disposed on the substrate support 110 (see FIG. 2) of the first station 10 (see FIG. 1).

Here, the substrate 610 may be a silicon substrate, a SOI (Silicon On Insulator) substrate, a gallium arsenic substrate, a silicon germanium substrate, a ceramic substrate, a quartz substrate, a glass substrate for display, or the like.

The insulating layer pattern 620 is a silicon oxide (SiOx) layer, and may be made of FOX (Flowable OXide), TOSZ (Tonen SilaZene), USG (Undoped Silicate Glass), BSG (Boro Silicate Glass), PSG (Phospho Silicate Glass), BPSG (BoroPhospho Silicate Glass), PE-TEOS (Plasma Enhanced—Tetra Ethyl Ortho Silicate), FSG (Fluoride Silicate Glass), HDP (high density plasma), or the like. The barrier layer 630 may be a TiN layer, a TiON layer, a TiW layer, a Ti layer/TiN layer, a Ti layer/TiON layer, a Ti layer/TiW layer, or the like.

The barrier layer 630 is composed of a Ti layer 632 and a TiN layer 634. The TiN layer 634 is used to increase adhesion between tungsten and the silicon oxide (SiOx)-based insulating layer pattern 620 and to prevent the penetration of $WF_6$ used for tungsten deposition into the substrate 610, etc. This is because tungsten has good step coverage but exhibits a large difference in internal stress at the interface between it and the silicon oxide (SiOx)-based insulating layer pattern 620, thereby leading to less adhesion with the silicon oxide (SiOx)-based insulating layer pattern 620. The Ti layer 632 can reduce the natural oxide layer formed on a surface of the substrate 610 exposed through the contact hole 622, and thus serves to reduce resistance of a tungsten plug.

Meanwhile, the TiN layer 634 may be formed by sputtering, MOCVD (Metal Organic Chemical Vapor Deposition), or the like. Since sputtering may cause poor step coverage, MOCVD is mainly used in formation of a tungsten plug with 0.13 μm or less. In the case of forming the TiN layer 634 by MOCVD, a carbon compound, TDMAT (Tetrakis DiMethyl Amino Titanium), is used as a precursor. Thus, 3–8% carbon remains in the TiN layer 634.

Referring to FIG. 3, the substrate 610 is sufficiently pre-heated (S520). That is, the substrate support of the first station on which the substrate 610 is disposed is adjusted to a temperature of 300 to 400° C. and the substrate 610 is pre-heated for 60 seconds or more. Here, when the pre-heating process and a silicon protective layer formation process as will be described later are performed on the same station, it is preferable that the temperature of the substrate support for the pre-heating process is the same as that for the silicon protective layer formation process. The pre-heating may be performed for 60 seconds or more to sufficiently pre-heat all areas of the substrate 610 and to sufficiently remove moisture and volatile materials attached to the substrate 610. For example, the substrate 610 may be pre-heated on the substrate support adjusted to about 395° C. for about 65 seconds.

Ar gas and $H_2$ gas are supplied to the shower head 120 (see FIG. 2) of the first station, and Ar gas is supplied to the substrate support of the first station, to maintain an internal pressure of the process chamber 100 (see FIG. 2) at a predetermined level.

Referring to FIGS. 3 and 4B, a silicon protective layer 640 is formed on the barrier layer 630 (S530). The silicon protective layer 640 prevents the exposure of a pinhole or carbon defect of the TiN layer 634 to a tungsten source gas to prevent the phenomenon where fluorine ions generated during a subsequent tungsten deposition process pass through the pinhole or carbon defect to react with the Ti layer 632 to thereby cause a volcano defect. In addition, considering that tungsten growth on the TiN layer 634 is poor, the formation of the silicon protective layer 640 prior to tungsten deposition enables easy tungsten nucleation in a tungsten nucleation process as will be described later.

While the substrate support 110 (see FIG. 2) of the first station 10 (see FIG. 1) is adjusted to a temperature of 300 to 400° C., a $SiH_4$ gas is supplied. To maintain an internal pressure in the process chamber 100 and move the $SiH_4$ gas, Ar gas and $H_2$ gas are supplied, simultaneously with the supply of the $SiH_4$ gas. For example, $SiH_4$ gas, Ar gas, and $H_2$ gas may be supplied to the shower head 120 of the first station 10, simultaneously with supplying Ar gas to the substrate support 110 of the first station 10. The $SiH_4$ gas may be supplied at a rate of 150 to 250 sccm (standard cubic centimeter per minute).

The silicon protective layer 640 is formed by the following reduction reaction scheme:

$$SiH_4 \rightarrow Si + 2H_2$$

Here, the $SiH_4$ gas is reduced at about 300° C. or more. As the reaction temperature increases, a deposition rate increases but the characteristics of the silicon protective layer 640 may be lowered. Thus, the substrate support 110 of the first station 10 may be adjusted to a temperature of 300 to 400° C. The formation of the silicon protective layer 640 may be done for 10 seconds or more to induce uniform growth of the silicon protective layer 640. By doing so, the penetration of $WF_6$ gas into the TiN layer 634 is prevented and good growth of tungsten nuclei is ensured. Even though a longer process duration can provide a more uniform silicon protective layer, it is necessary to control the process duration in view of yield. For example, the substrate 610 may be heated on the substrate support 110 of the first station 10 adjusted to about 395° C. for about 15 seconds. The silicon protective layer 640 thus formed may have a thickness of 30 to 50 Å, but the present invention is not limited thereto.

Referring to FIGS. 3 and 4C, the substrate 610 migrates to the second station 20 (see FIG. 1), and a tungsten nucleation layer 650 is formed on the silicon protective layer 640 (S540).

In the illustrative embodiment, the tungsten nucleation layer 650 may be formed by a PNL (Pulsed Nucleation Layer) deposition technique. The PNL deposition technique is a tungsten nucleation process repeated by short-term cycles: supply of a tungsten source gas ($WF_6$); purge of the tungsten source gas ($WF_6$); supply of a silicon source gas ($SiH_4$); and purge of the silicon source gas ($SiH_4$). The tungsten nucleation process may be done on the substrate support 110 (see FIG. 2) of the second station 20 adjusted to 300 to 350° C. for 60 seconds or more.

The tungsten nucleation process (S540) will now be described in more detail with reference to FIG. 5.

Referring first to FIG. 5, a tungsten source gas layer 652a is formed by supply of a $WF_6$ gas (S542). Here, the $WF_6$ gas may be supplied at a rate of 250 to 300 sccm for about 0.3 seconds. To maintain the internal pressure of the process chamber 100 and move the $WF_6$ gas, an Ar gas and a $H_2$ gas are supplied at the same time. For example, $WF_6$ gas, Ar gas, and $H_2$ gas may be supplied to the shower head 120 (see FIG. 2) of the second station 20, simultaneously while supplying Ar gas to the substrate support of the second station 20.

Then, $WF_6$ gas is purged (S544). To this end, the flow rates of Ar gas and $H_2$ gas may be increased. Alternatively, although not shown, a separate purge gas (e.g., He gas, Ne gas, $N_2$ gas, etc.) may also be supplied. The Ar gas, $H_2$ gas, and the separate purge gas can promote purging of the $WF_6$ gas, and at the same time, can compress the tungsten source gas layer 652a onto the silicon protective layer 640.

Then, the tungsten source gas layer 652a is reduced by supply of $SiH_4$ gas (S546). Here, the $SiH_4$ gas may be supplied at a flow rate of 150 to 250 sccm for about 2 seconds. To maintain the internal pressure of the process chamber 100 and carry the $SiH_4$ gas, Ar gas and $H_2$ gas are supplied at the same time.

The tungsten source gas layer 652a is reduced by the following reaction scheme:

$$2WF_6 + 3SiH_4 \rightarrow 2W + 3SiF_4 + 6H_2$$

Then, the SiH$_4$ gas is purged (S548). To this end, the flow rates of Ar gas and H$_2$ gas may be increased. Alternatively, although not shown, a separate purge gas (e.g., He gas, Ne gas, N$_2$ gas, etc.) may also be supplied.

The tungsten nucleation layer 650 thus formed may have a thickness of 100 to 150 Å according to a PNL cycle number, but the present invention is not limited thereto.

Turning to FIGS. 3 and 4D, the substrate 610 sequentially migrates to third and fourth stations 30 and 40 (see FIG. 1), to grow a bulk tungsten layer 660$a$ from the tungsten nucleation layer 650 (S550). The bulk tungsten layer 660$a$ is formed in the third and fourth stations 30 and 40. For example, to form the bulk tungsten layer 660$a$ with a thickness of 3,000 Å, a tungsten layer with a thickness of 1,500 Å may be formed in the third station 30 and 40 and then tungsten may be deposited up to a thickness of 1,500 Å on the tungsten layer in the fourth station 40.

While substrate supports 110 (see FIG. 2) of the third and fourth stations 30 and 40 are adjusted to a temperature of 350 to 400° C., WF$_6$ gas and H$_2$ gas are supplied. To maintain the internal pressure of the process chamber 100 and carry the WF$_6$ gas, Ar gas is supplied at the same time. For example, WF$_6$ gas, Ar gas, and H$_2$ gas may be supplied to shower heads 120 (see FIG. 2) of the third and fourth stations 30 and 40, simultaneously with supplying an Ar gas and a H$_2$ gas to the substrate supports 110 of the third and fourth stations 30 and 40. The WF$_6$ gas and the H$_2$ gas may be supplied at a flow rate of 150–250 sccm and 12,000–19,000 sccm, respectively.

The bulk tungsten layer 660$a$ is formed by the following reduction reaction scheme:

In particular, the temperature of the substrate supports 10 of the third and fourth stations 30 and 40 for the formation of the bulk tungsten layer 660$a$ is higher than the temperature of the substrate support of the second station 20 for the formation of the tungsten nucleation layer 650. Generally, when the bulk tungsten layer 660$a$ is deposited at high temperature, filling characteristics are lowered but the deposition rate increases. On the other hand, when the bulk tungsten layer 660$a$ is deposited at low temperature, filling characteristics are enhanced but the deposition rate decreases. However, when the tungsten nucleation layer 650 is formed by a PNL deposition technique, the formation of the tungsten nucleation layer 650 can be promoted since the tungsten source gas layer 652$a$ (see FIG. 5) is formed at the atomic layer level. In this case, even when the bulk tungsten layer 660$a$ is deposited on the substrate support adjusted to high temperature, good filling characteristics and high throughput can be ensured.

As described above, the process of forming the bulk tungsten layer 660$a$ is significantly affected by temperature. That is, as a process temperature increases, a deposition rate increases but the filling characteristics of the contact hole 622 (see FIG. 4C) are lowered. On the other hand, as the process temperature decreases, a deposition rate decreases but the filling characteristics of the contact hole 622 are enhanced. Thus, the bulk tungsten layer 660$a$ may be formed at 400° C. or less to enhance filling characteristics considering the reduction of feature size.

The bulk tungsten layer 660$a$ thus formed may have a thickness of 2,000 Å or more, but the present invention is not limited thereto.

Referring to FIGS. 3 and 4E, the bulk tungsten layer 660$a$ is planarized so that an upper surface of the insulating layer pattern 620 is exposed, to thereby complete a tungsten plug 660. Here, the planarization may be done by a chemical mechanical planarization (CMP) process or an etch-back process.

According to the method of manufacturing the semiconductor device of the embodiment of the present invention shown in FIGS. 3 through 4E, the penetration of fluorine ions derived from a WF$_6$ gas into the Ti layer 632 can be prevented by pre-heating the substrate 610 at 300 to 400° C. for 60 seconds or more, followed by heating the same for 10 seconds or more with supply of a SiH$_4$ gas, thereby forming the silicon protective layer 640. Thus, the TiN layer 634 can be formed as a thin layer, thereby reducing the resistance of the tungsten plug 660. In addition, since fluorine ions do not penetrate the TiN layer 634, the resistance of the tungsten plug 660 can be reduced. As a result, the resistance-capacitance (RC) delay of the semiconductor device can be reduced, thereby enhancing operation characteristics.

Figure 6:
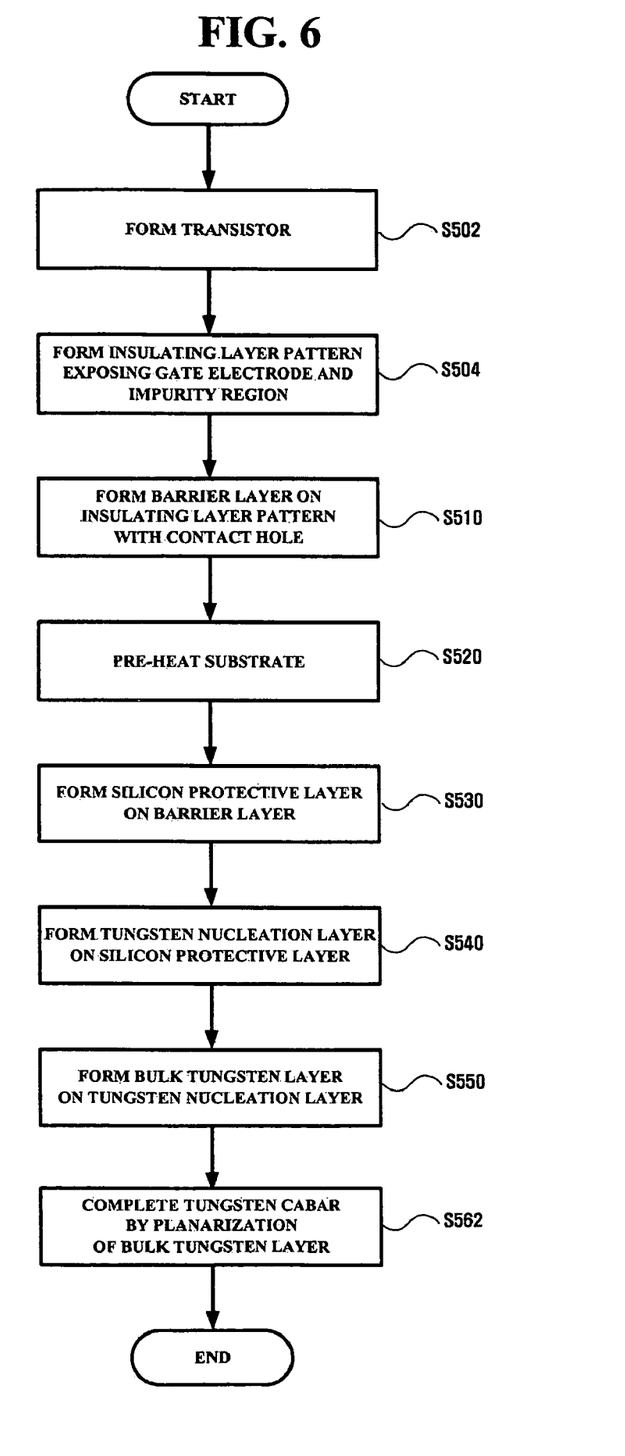
FIG. 6 is a flow diagram illustrating formation of tungsten CABAR (ContAct BAR) using a method of manufacturing a semiconductor device according to an embodiment of the present invention.
Figure 7:
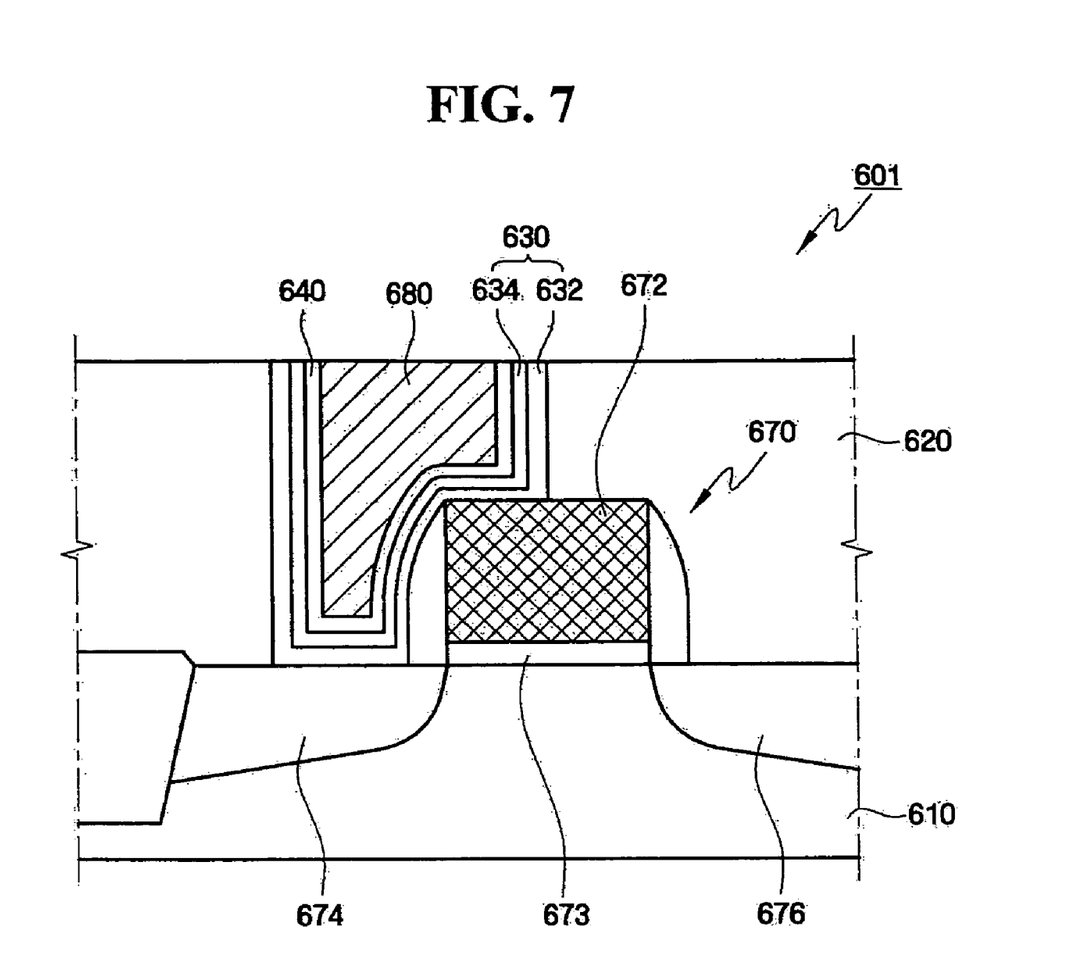
FIG. 7 is a sectional view of tungsten CABAR formed using a method of manufacturing a semiconductor device according to an embodiment of the present invention.

FIG. 6 is a flow diagram illustrating formation of tungsten CABAR (ContAct BAR) using a method of manufacturing a semiconductor device according to an embodiment of the present invention, and FIG. 7 is a sectional view of tungsten CABAR formed using a method of manufacturing a semiconductor device 601, according to an embodiment of the present invention. In FIGS. 6 and 7, substantially the same constitutional elements as in FIGS. 3 through 4E are represented by the same reference numerals, and thus, a detailed description thereof will not be given.

Referring to FIGS. 6 and 7, first, a transistor 670 is formed on a semiconductor substrate 610 (S502). For example, an insulating layer and a conductive layer are sequentially deposited and patterned to form a gate insulating layer 673 and a gate electrode 672, respectively. Impurity regions 674 and 676 are formed in an aligned relation with respect to the gate electrode 672.

Then, an insulating layer pattern 620 is formed to expose the gate electrode 672 and the impurity region 674 or 676 of the transistor 670 (S504). That is, through the insulating layer pattern 620, the gate electrode 672 and the impurity region 674 or the gate electrode 672 and the impurity region 676 are exposed.

A barrier layer 630 is formed on the insulating layer pattern 620 (S510) and the substrate 610 is sufficiently pre-heated (S520). Then, a silicon protective layer 640 is formed on the barrier layer 630 (S530) and a tungsten nucleation layer is formed on the silicon protective layer 640 (S540). A bulk tungsten layer is grown from the tungsten nucleation layer (S550) and planarized to complete tungsten CABAR (ContAct BAR) 680 (S562). Here, the tungsten CABAR 680 refers to a bar-shaped contact plug connecting the gate electrode 672 and the impurity regions 674 and 676 of the transistor 670 with semiconductor chip size shrinkage.

The present invention will be described in detail through the following concrete experimental examples. However, the experimental example is for illustrative purposes and other examples and applications can be readily envisioned by a person of ordinary skill in the art. Since a person skilled in the art can sufficiently analogize the technical contents which are not described in the following concrete experimental examples, the description thereabout is omitted.

EXPERIMENTAL EXAMPLE 1

First, a substrate was subjected to silicidation and an insulating layer pattern was formed on the substrate. A Ti layer and a TiN layer were conformally formed to a thickness of 150 Å and 45 Å, respectively, on the insulating layer pattern. Then, the substrate was pre-heated at about 395° C.

for about 65 seconds, and heated at about 395° C. for about 15 seconds with supply of a $SiH_4$ gas to form a silicon protective layer. Then, a $WF_6$ gas and a $SiH_4$ gas were alternately supplied according to a PNL deposition technique at about 325° C. to form a tungsten nucleation layer with a thickness of 100 Å. The tungsten nucleation layer was grown to a bulk tungsten layer with a thickness of 3,000 Å by reduction of $WF_6$ gas at 395° C. The bulk tungsten layer was planarized by a CMP process so that the upper surface of the insulating layer pattern was exposed to thereby complete a tungsten plug.

Figure 8:
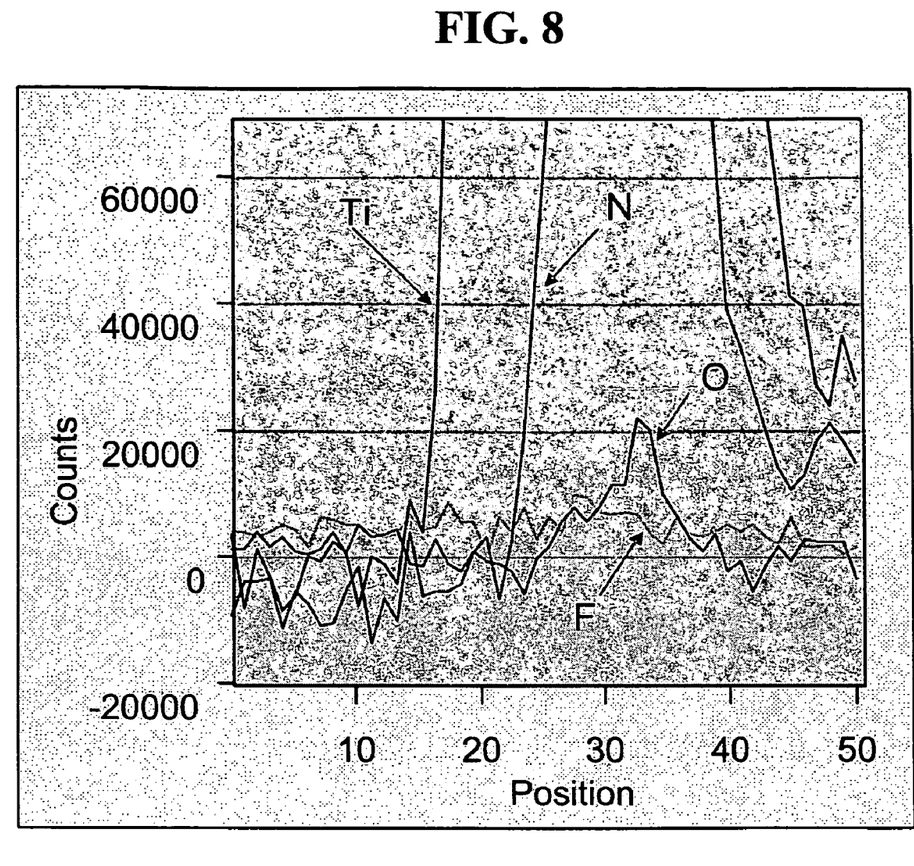
FIG. 8 illustrates the results of element analysis with respect to the position of a semiconductor device manufactured according to an embodiment of the present invention.

Then, element analysis with respect to a position, i.e., the substrate, the Ti layer/TiN layer, and tungsten plug, was performed and the results are shown in FIG. 8.

Referring to FIG. 8, the x-axis indicates the relative position and the y-axis indicates ion counts. A significant reduction of fluorine ions (F) was observed. The result shows that even though the TiN layer formed was as thin as 45 Å, the penetration of fluorine ions into the Ti layer and the substrate was rare.

EXPERIMENTAL EXAMPLE 2

First, substrates were subjected to silicidation and an insulating layer pattern was formed on the substrates. A Ti layer and a TiN layer were formed to a thickness of 150 Å and 90 Å, respectively (see a1, b1, c1 of FIG. 9), or to a thickness of 150 Å and 45 Å, respectively (see d1, e1 of FIG. 9), on the insulating layer pattern. Then, the substrates were pre-heated to approximately 325° C. for about 10 seconds, and heated to approximately 325° C. for about 5 seconds with supply of a $SiH_4$ gas to form a silicon protective layer. Then, a $WF_6$ gas and a $SiH_4$ gas were alternately supplied at about 325° C. to form a tungsten nucleation layer with a thickness of 100 Å. The tungsten nucleation layer was grown to a bulk tungsten layer with a thickness of 3,000 Å by reduction of $WF_6$ gas at 395° C. The bulk tungsten layer was planarized by a CMP process so that the upper surface of the insulating layer pattern was exposed to thereby complete the tungsten plugs.

On the other hand, substrates were subjected to silicidation and an insulating layer pattern was formed on the substrates. A Ti layer and a TiN layer were conformally formed to a thickness of 150 Å and 90 Å, respectively (see a2, b2, c2 of FIG. 9), or to a thickness of 150 Å and 45 Å, respectively (see d2, e2 of FIG. 9), on the insulating layer pattern. Then, the substrates were pre-heated at about 395° C. for about 65 seconds, and heated at about 395° C. for about 15 seconds with supply of $SiH_4$ gas to form a silicon protective layer. Then, $WF_6$ gas and $SiH_4$ gas were alternately supplied at about 325° C. to form a tungsten nucleation layer with a thickness of 100 Å. The tungsten nucleation layer was grown to a bulk tungsten layer with a thickness of 3,000 Å by reduction of $WF_6$ gas at 395° C. The bulk tungsten layer was planarized by a CMP process so that an upper surface of the insulating layer pattern was exposed to thereby complete tungsten plugs.

Figure 9:
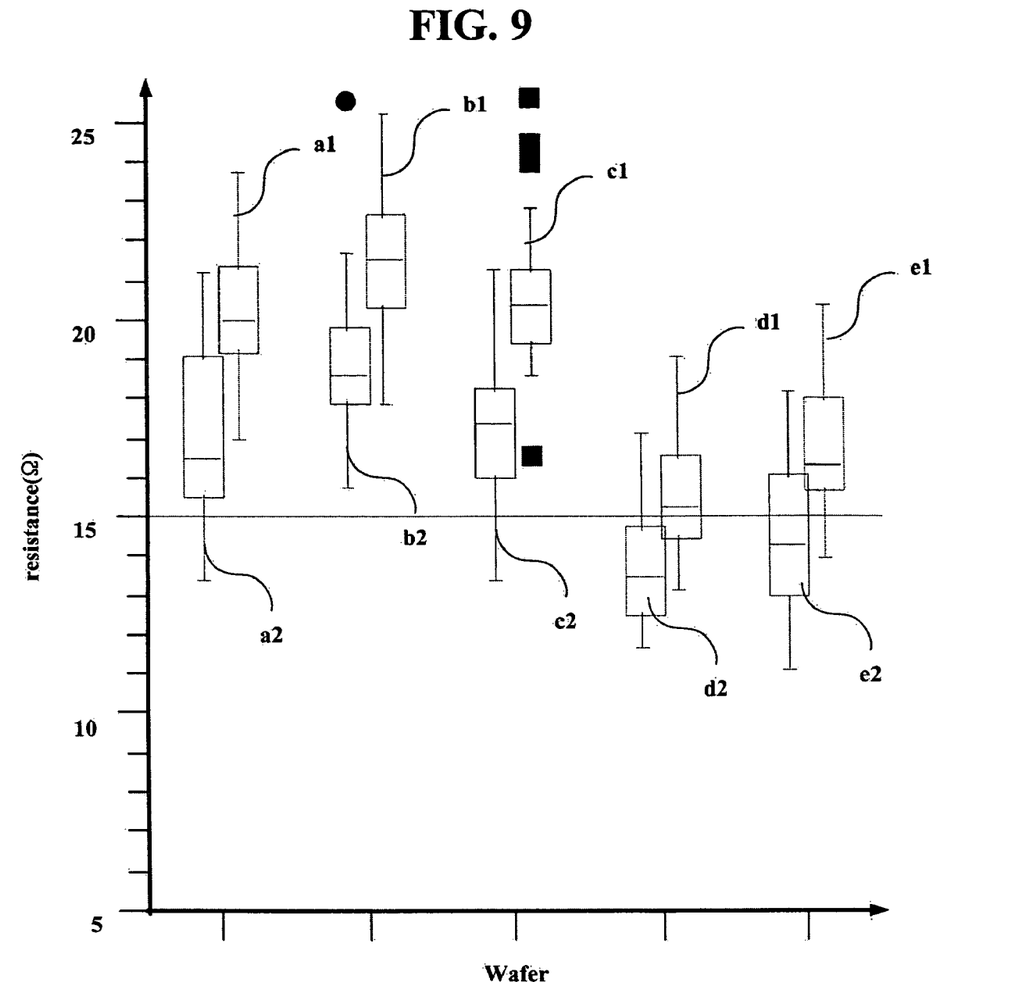
FIG. 9 illustrates the measurement of resistance with respect to the position of a semiconductor device manufactured according to an embodiment of the present invention.

The resistances of the tungsten plugs (a1–e1 and a2–e2) were measured and the results are shown in FIG. 9.

Referring to FIG. 9, the resistance of the tungsten plugs a1–c1 was about 21Ω, and the resistance of the tungsten plugs a2–c2 was about 16Ω. The resistance of the tungsten plugs d1–e1 was about 18Ω and the resistance of the tungsten plugs d2–e2 was about 14Ω. This shows that a pre-heating process and a silicon protective layer formation process can be performed at high temperature for a long time, thereby promoting the formation of a silicon protective layer. This shows that even though a thin TiN layer is used, the penetration of fluorine ions generated during formation of a bulk tungsten layer to a Ti layer and a substrate can be prevented, thereby reducing the resistance of a tungsten plug.

EXPERIMENTAL EXAMPLE 3

First, a substrate was subjected to silicidation and a transistor was formed on the substrate. An insulating layer pattern exposing a gate electrode and impurity regions of the transistor was then formed. A Ti layer and a TiN layer were conformally formed to a thickness of 150 Å and 45 Å, respectively, on the insulating layer pattern. Then, the substrate was pre-heated at about 395° C. for about 65 seconds, and heated at about 395° C. for about 15 seconds with supply of a $SiH_4$ gas to form a silicon protective layer. Then, a $WF_6$ gas and a $SiH_4$ gas were alternately supplied at about 325° C. to form a tungsten nucleation layer with a thickness of 100 Å. The tungsten nucleation layer was grown to a bulk tungsten layer with a thickness of 3,000 Å by reduction of a $WF_6$ gas at 395° C. The bulk tungsten layer was planarized by a CMP process so that an upper surface of the insulating layer pattern was exposed to thereby complete tungsten CABAR.

Figure 10:
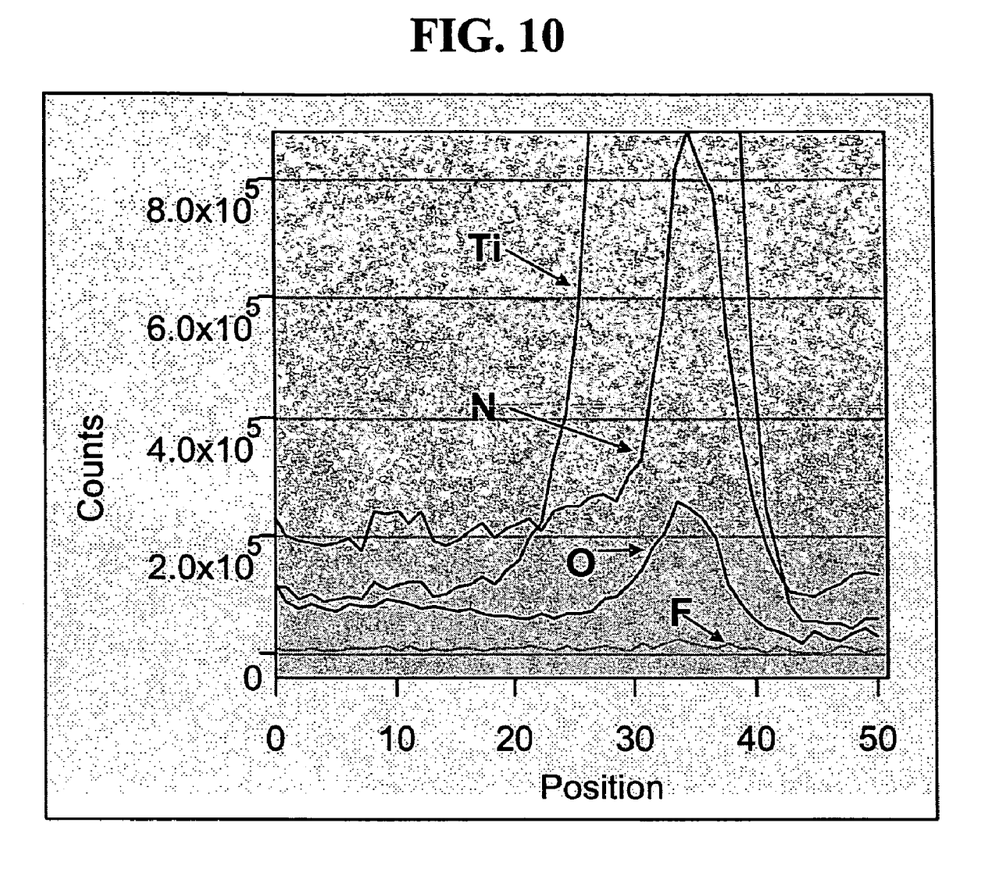
FIG. 10 illustrates the results of element analysis with respect to the position of tungsten CABAR manufactured according to the flowchart of FIG. 6.

Then, element analysis with respect to a position, i.e., the substrate, the Ti layer/TiN layer, and the tungsten CABAR, was performed and the results are shown in FIG. 10.

Referring to FIG. 10, the x-axis indicates relative position and the y-axis indicates ion counts. A significant reduction of fluorine ions (F) was observed. This shows that even though the TiN layer was formed by alternately supplying $WF_6$ gas and $SiH_4$ gas to a small thickness, i.e., 45 Å, the penetration of fluorine ions into the Ti layer and the substrate rarely occurred.

EXPERIMENTAL EXAMPLE 4

First, substrates were subjected to silicidation and a transistor was formed on the substrates. An insulating layer pattern exposing a gate electrode and impurity regions of the transistor was then formed. A Ti layer and a TiN layer were formed to a thickness of 150 Å and 90 Å, respectively (see a3, b3, c3 of FIG. 11), or to a thickness of 150 Å and 45 Å, respectively (see d3, e3 of FIG. 1), on the insulating layer pattern. Then, the substrates were pre-heated at about 325° C. for about 10 seconds, and heated at about 325° C. for about 5 seconds with supply of a $SiH_4$ gas to form a silicon protective layer. Then, a $WF_6$ gas and a $SiH_4$ gas were alternately supplied at about 325° C. to form a tungsten nucleation layer with a thickness of 100 Å. The tungsten nucleation layer was grown to a bulk tungsten layer with a thickness of 3,000 Å by reduction of $WF_6$ gas at 395° C. The bulk tungsten layer was planarized by a CMP process so that an upper surface of the insulating layer pattern was exposed to thereby complete tungsten CABARs.

On the other hand, substrates were subjected to silicidation and a transistor was formed on the substrates. An insulating layer pattern exposing a gate electrode and impurity regions of the transistor was then formed. A Ti layer and a TiN layer were conformally formed to thicknesses of 150 Å and 90 Å, respectively (see a4, b4, c4 of FIG. 11), or to thicknesses of 150 Å and 45 Å, respectively (see d4, e4 of FIG. 11), on the insulating layer pattern. Then, the substrates were pre-heated at about 395° C. for about 65 seconds, and heated at about 395° C. for about 15 seconds with supply of $SiH_4$ gas to form a silicon protective layer. Then, $WF_6$ gas and $SiH_4$ gas were alternately supplied at about 325° C. to form a tungsten nucleation layer with a thickness of 100 Å. The tungsten nucleation layer was grown to a bulk tungsten layer with a thickness of 3,000 Å by reduction of $WF_6$ gas at 395° C. The bulk tungsten layer was planarized by a CMP process so that an upper surface of the insulating layer pattern was exposed to thereby complete tungsten CABARs.

Figure 11:
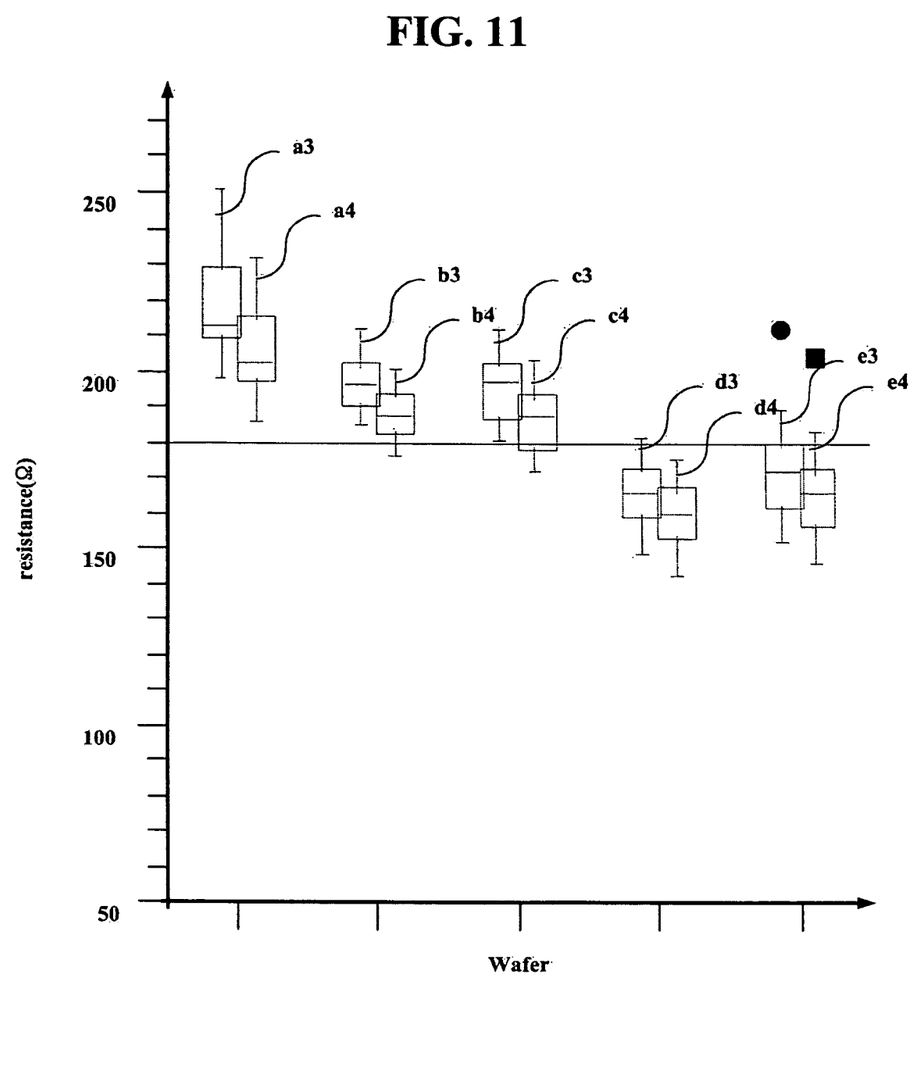
FIG. 11 illustrates the measurement of resistance with respect to the position of tungsten CABAR manufactured according to the flowchart of FIG. 6.

The resistances of the tungsten CABARs (a3–e3 and a4–e4) were measured and the results are shown in FIG. 11.

Referring to FIG. 11, the resistance of the tungsten CABARs a3–c3 was about 190–210Ω, and the resistance of the tungsten CABARs a4–c4 was about 180–210Ω. The resistance of the tungsten CABARs d3–e3 was about 120–130Ω and the resistance of the tungsten CABARs d4–e4 was about 110–120Ω. This shows that a pre-heating process and a silicon protective layer formation process can be performed at high temperature for a long time, thereby promoting the formation of the silicon protective layer. This shows that even though a thin TiN layer is used, the penetration of fluorine ions generated during formation of a bulk tungsten layer into a Ti layer and a substrate can be prevented, thereby reducing the resistance of tungsten CABAR.

A method of manufacturing a semiconductor device provides the following advantages.

First, since a substrate is pre-heated at 300 to 400° C. for 60 seconds or more and then heated for 10 seconds or more with supply of $SiH_4$ gas to form a silicon protective layer, the penetration of fluorine ions derived from $WF_6$ gas into a Ti layer can be prevented. Therefore, a TiN layer can be formed a thin layer and thus resistance of a tungsten plug can be reduced.

Second, an RC delay can be reduced, thereby enhancing operation characteristics and reliability.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects.

What is claimed is:

1. A method of manufacturing a semiconductor device, the method comprising:
    disposing a substrate on a substrate support in a process chamber;
    pre-heating the substrate on the substrate support adjusted to temperature from 300° C. to 400° C. for 60 seconds or more;
    forming a silicon protective layer on the substrate by supplying a silicon source gas into the process chamber and heating the substrate on the substrate support adjusted to a temperature from 300° C. to 400° C. for 10 seconds or more; and
    forming a tungsten layer on the silicon protective layer.

2. The method of claim 1, wherein in the pre heating, the substrate is pre-heated on the substrate support adjusted to a temperature of about 395° C. for about 65 seconds.

3. The method of claim 1, wherein in the forming of the silicon protective layer, the substrate is heated on the substrate support adjusted to a temperature of about 395° C. for about 15 seconds.

4. The method of claim 1, wherein the forming of the tungsten layer comprises:
    forming a tungsten nucleation layer on the silicon protective layer; and
    forming a bulk tungsten layer from the tungsten nucleation layer.

5. The method of claim 4, wherein forming the tungsten nucleation layer comprises:
    supplying a tungsten source gas into the process chamber;
    purging the tungsten source gas;
    supplying a silicon source gas into the process chamber; and
    purging the silicon source gas.

6. The method of claim 4, wherein forming the tungsten nucleation layer is performed at a lower temperature than forming the bulk tungsten layer.

7. The method of claim 1, wherein an insulating layer pattern and a barrier layer conformally formed on the insulating layer pattern are formed on the substrate disposed on the substrate support, and the silicon protective layer is formed on the barrier layer.

8. The method of claim 7, wherein a transistor is disposed under the insulating layer pattern, and a gate electrode and an impurity region of the transistor are exposed through the insulating layer pattern.

9. The method of claim 7, wherein the barrier layer is a TiN layer, a TiON layer, a TiN layer, a Ti layer/TiN layer, a Ti layer/TiON layer, or a Ti layer/TiW layer.

10. A method of manufacturing a semiconductor device, the method comprising:
    pre-heating a substrate;
    forming a tungsten nucleation layer on the substrate by repeated cycles of supplying a tungsten source gas, purging the tungsten source gas, supplying a silicon source gas, and purging the silicon source gas; and
    forming a bulk tungsten layer at a higher temperature than in the formation of the tungsten nucleation layer.

11. The method of claim 10, wherein the forming of the tungsten nucleation layer is performed on a substrate support adjusted to a temperature of about 325° C., and the forming of the bulk tungsten layer is performed on a substrate support adjusted to a temperature of about 395° C.

12. The method of claim 10, further comprising:
    forming a silicon protective layer on the substrate.

13. The method of claim 12, wherein in the pre-heating, the substrate is pre-heated on the substrate disposed on a substrate support adjusted to a temperature of about 395° C. for about 65 seconds.

14. The method of claim 10, further comprising:
    forming a silicon protective layer on the substrate with the silicon source gas supplied thereto and the substrate disposed on a substrate support adjusted to a temperature from 300° C. to 400° C. and heated for 10 seconds or more.

15. The method of claim 14, wherein the forming of the silicon protective layer is performed by heating the substrate support at a temperature of about 395° C. for 15 seconds.

16. The method of claim 14, wherein an insulating layer pattern and a barrier layer conformally formed on the insulating layer pattern are formed on the substrate, and the silicon protective layer is formed on the barrier layer.

17. The method of claim 16, wherein the barrier layer is a TiN layer, a TiON layer, a TiW layer, a Ti layer/TiN layer, a Ti layer/TiON layer, or a Ti layer/TiW layer.

18. The method of claim 16, wherein a transistor is disposed under the insulating layer pattern, and a gate electrode and an impurity region of the transistor are exposed through the insulating layer pattern.

19. The method of claim 18, wherein the barrier, layer is a TiN layer, a TiON layer, a TiW layer, a Ti layer/TiN layer, a Ti layer/TiON layer, or a Ti layer/TiW layer.

20. The method of claim 10, wherein preheating is performed at a temperature from 300° C. to 400° C. for 60 seconds or more.

* * * * *